United States Patent [19]

Loeb et al.

[11] 4,203,063
[45] May 13, 1980

[54] MOVEMENT DETECTING APPARATUS AND METHOD

[75] Inventors: Paul Loeb, Glassboro; Irving P. Magasiny, Cheltenham, both of N.J.

[73] Assignee: RCA Corporation, New York, N.Y.

[21] Appl. No.: 828,752

[22] Filed: Aug. 29, 1977

[51] Int. Cl.² ............................................. G05B 19/28
[52] U.S. Cl. .................................... 318/603; 318/640; 318/653; 324/78 D; 324/115
[58] Field of Search ............... 318/597, 603, 640, 653, 318/561; 324/166, 115, 78 D, 77 D

[56] References Cited

U.S. PATENT DOCUMENTS

| | | | |
|---|---|---|---|
| 3,622,855 | 11/1971 | Hodgin et al. | 318/603 |
| 3,665,323 | 5/1972 | Peterson | 328/14 |
| 3,914,677 | 10/1975 | MacWade et al. | 318/561 |
| 3,990,007 | 11/1976 | Hohhof | 328/78 D |

OTHER PUBLICATIONS

"Synthesizer Designed for Home Use" *Electronics*, 4/14/77 pp. 151-152.

*Primary Examiner*—J. V. Truhe
*Assistant Examiner*—Eugene S. Indyk
*Attorney, Agent, or Firm*—H. Christoffersen; Samuel Cohen; Joseph D. Lazar

[57] ABSTRACT

Apparatus and method for detecting the movement of a control device (such as a tuning knob) for controlling the input to a controlled device (such as a frequency synthesizer or display) operating in discrete or digital steps. The rotational direction of a single tuning device such as a "tuning" knob causes an increase or decrease of the frequency. The rate of movement of the positioning device determines frequency bandswitching in differing degrees of coarse to fine tuning modes. The utilization of rotational direction and rate of the device provides a single control for all tuning functions.

The apparatus and method is useful in both open and closed (servo) loop systems.

19 Claims, 9 Drawing Figures

MOVEMENT DETECTING APPARATUS AND METHOD

BACKGROUND OF THE INVENTION

1. Field of the Invention

This invention relates to a method and apparatus for controlling digitally operated equipment.

2. Description of the Prior Art

Typical techniques of controlling digitally operated equipment such as radio receivers, transmitters, transceivers and synthesizers employ separate switches for bandswitching, and tuning knobs for coarse and fine tuning. The operator by manipulating switches and knobs tunes the digital equipment to the desired frequency. In such equipment, the frequency is obtained by separate manual actions to switch to the frequency band, then to adjust the coarse knob for the approximate frequency and finally to adjust the fine knob to the actual frequency.

For example, U.S. Pat. No. 3,665,323 entitled "Proportional Digital Control for Radio Frequency Synthesizer," issued May 23, 1972, to Max E. Peterson, describes a system for tuning manually a frequency synthesizer with one three-position switch and one fine tuning dial. Magnetic or optical encoders are used to sense the movement of the tuning dial. Since the fine tuning dial requires 1,500 revolutions of the dial to tune through a band of 0 to 15 MHz, a three-position switch is provided to select each of three portions of the total band in which the fine tuning knob is operating to reduce the number of revolutions required for each tuning band.

An article, entitled "Synthesizer Designed for Bench Use," published in *Electronics,* Apr. 14, 1977, pages 151 to 152 describes another prior art frequency synthesizer. Tuning is achieved with one knob, and two push buttons. To tune to a desired frequency, the knob whose movement is sensed optically, is first operated with one push button and then with the other push button to provide coarse and fine tuning.

The prior art tuning systems do not provide a single control for tuning.

SUMMARY OF THE INVENTION

According to this invention, single continuous tuning is provided by sensing the rate and displacement of the movement of a moveable device. The device may be formed of optical, or magnetic means in conjunction with a conventional tuning knob to provide signals indicative of displacement and rate of movement (angular velocity) of the tuning control. Means are provided to produce preselected ranges of control signals, indicative of bandswitching for coarse and fine tuning movement indications.

DETAILED DESCRIPTION OF THE PREFERRED EMBODIMENT

Figure 1:
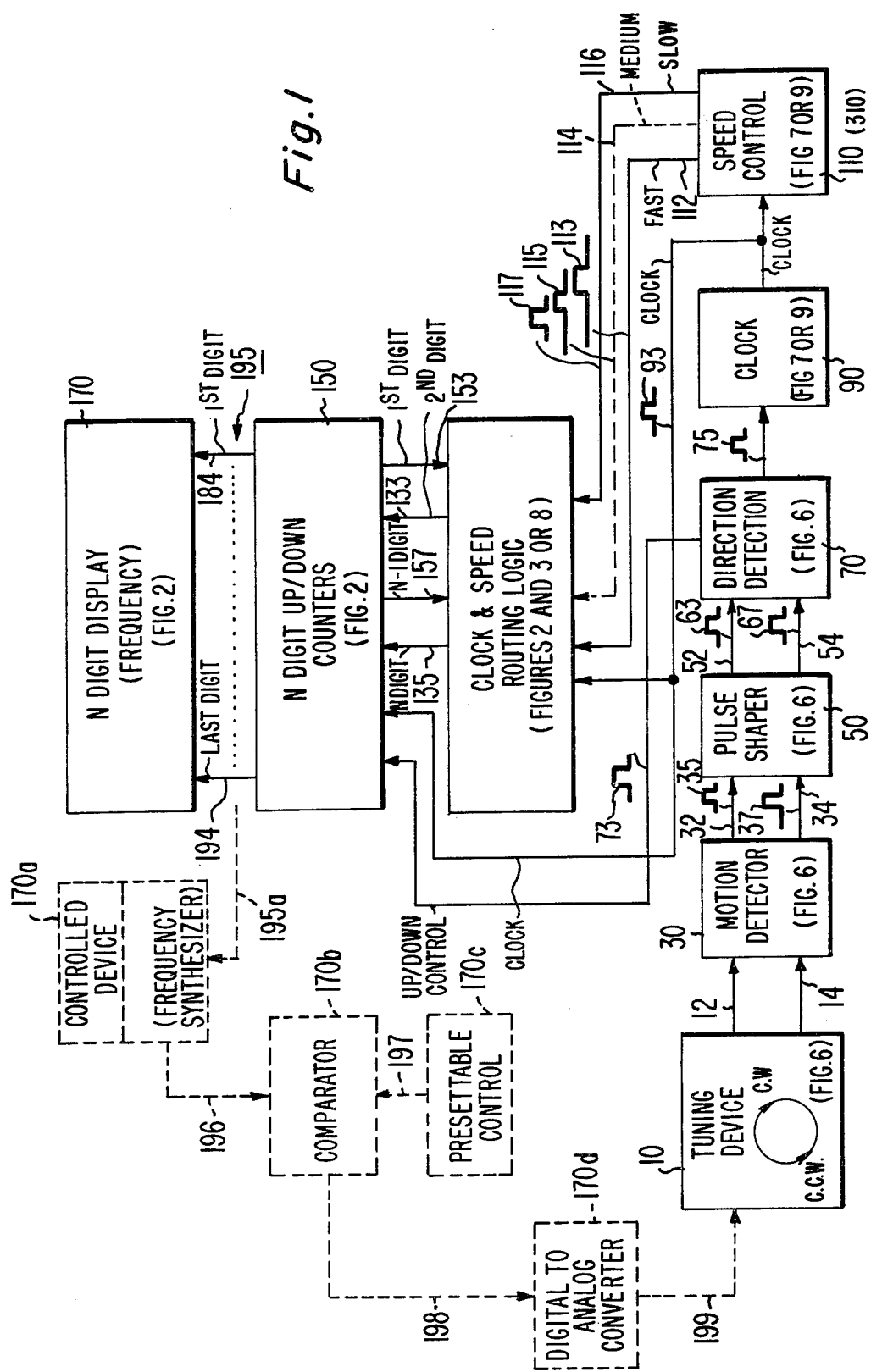
FIG. 1 is a block schematic of the preferred embodiment of the invention.

FIG. 1 illustrates the arrangement and organization in general of the main components of the preferred embodiment of the invention. A general description of the invention will be made by reference to FIG. 1, while a more detailed description will be given with reference to the detailed FIGS. 2-9.

The present invention utilizes a single tuning device 10 for tuning frequency tunable equipment that responds to input frequency selection or tuning signals in digital format. Such equipment includes synthesizers, radio frequency receivers, transmitters, transceivers, transponders, signal generators, process controls, etc. The device 10 may be utilized in any control system, whether it be open or closed (servo-type) loops.

Rotation of tuning device 10 produces two electrical signals that are supplied to a motion detector 30 over signal paths 12 and 14, respectively, each signal being generally of fixed amplitude and the two signals being phase-separated by constant phase angle. Detector 30 senses the signals to generate detected signals 35 and 37 over signal paths 32 and 34, respectively, for pulse shaping by pulse shaper 50. Pulse shaper 50 routes shaped signals 63 and 67 to direction-detection logic 70 over signal paths 52 and 54. Detection logic 70 by the comparison of the phasing between signals 35 and 37 produces up/down control signal 73 and clock reference signal 75. Signal 73 is routed to up/down counters 150 over signal path 72 to increment (up) or decrement (down) the counter contents. The contents of counters 150 are displayed by digital display 170. The contents of the counters 150 may also be used simultaneously to control a synthesizer or other digital devices via suitable coupled paths, not shown.

Reference signal 75 is supplied to a conventional clock 90 over signal path 74. Clock signal 93 is then generated by the negative going edge of signal 75. Clock signal 93 is bussed to speed control logic 110 and counters 150. The up/down counters 150 utilize the clock signal 93 as their least significant bit (LSB) control. The least significant bit (LSB) control varies according to the rate of movement of tuning device 10 as will be explained.

Speed control logic 110 produces two or more preselected ranges of control signals. In the example being described, three ranges are provided, namely, slow 117, medium 115, or fast 113 control signals over signal paths 116, 114, 112, respectively, for routing by clock and speed control routing logic 130.

Speed control signals 117, 115, 113 are determined by the repetition rate of clock signal 93. Routing logic 130 determines to which stage of the up/down counters 150 clock signal 93 will be routed under control of speed control signals 117 (slow), 115 (medium), or 113 (fast).

Figure 2:
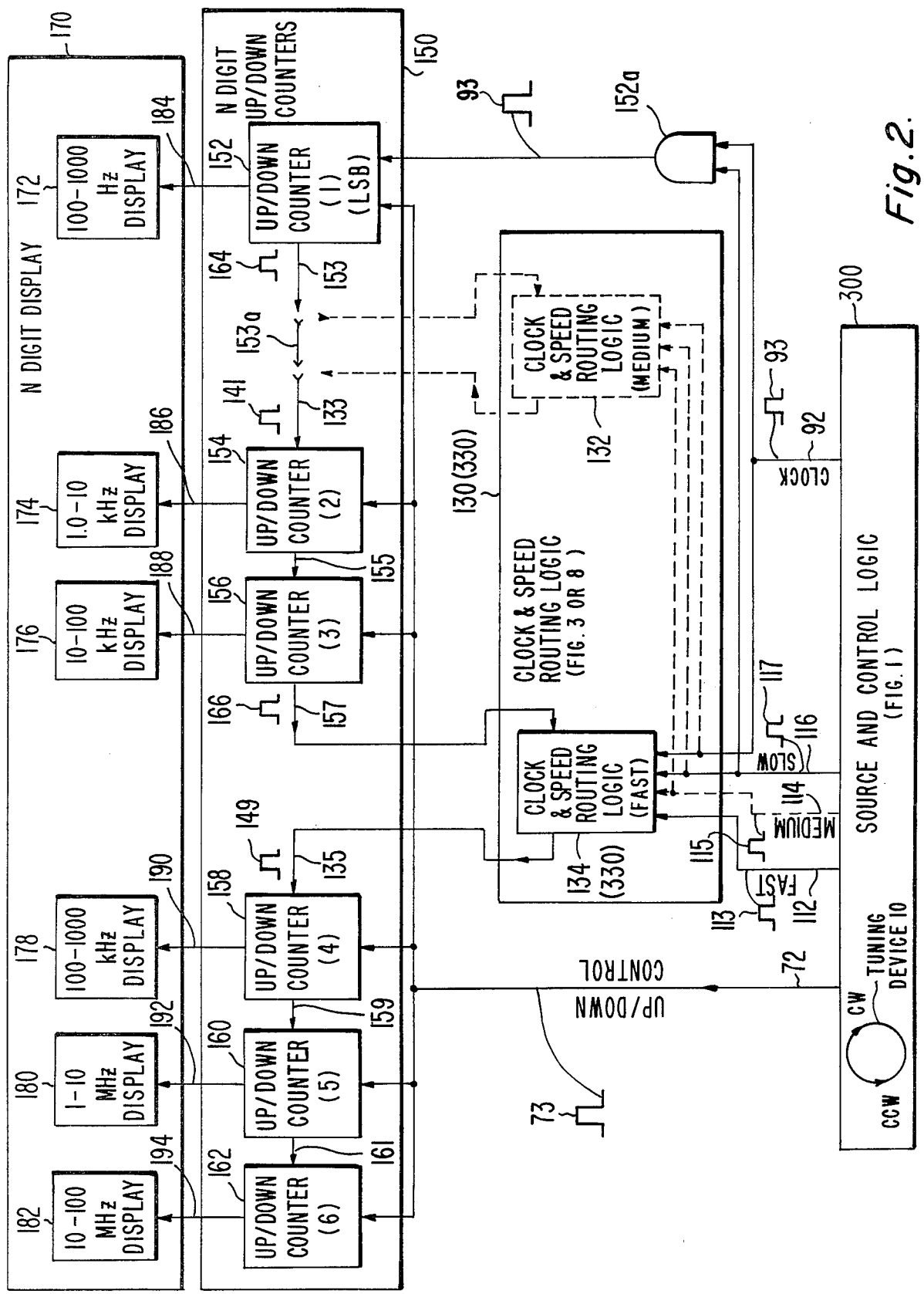
FIG. 2 is a detailed block schematic of portions of the schematic of FIG. 1.

The embodiment illustrated by FIGS. 1, 2, 3, 4, 5, 6, and 7 inclusive are directed specifically to a system providing for three speed control modes, namely, slow, medium, and fast. Hereinafter with respect to FIGS. 8 and 9, modifications of the embodiment will be described to provide for a two speed control mode of operation. In order to simplify the description of such a two-speed mode in keeping with the description of the three mode system now being described, FIG. 1 has been provided with dotted lines for the optional "medium" speed control line 114; FIG. 2 is shown with dotted lines for the optional clock and speed routing logic "medium." It should be understood, therefore, that in the modification the system for the two-speed control mode the dotted lined logic and interconnections are not required. The dotted line blocks 170a, 170b, 170c and 170d will be discussed hereinafter in the description of a closed-loop system utilizing the invention.

The tuning device 10, motion detector 30, pulse shaper 50, direction detection logic 70, clock 90, and speed control logic 110, are shown on FIG. 2 under the general classification of source and control logic 300.

Figure 6:
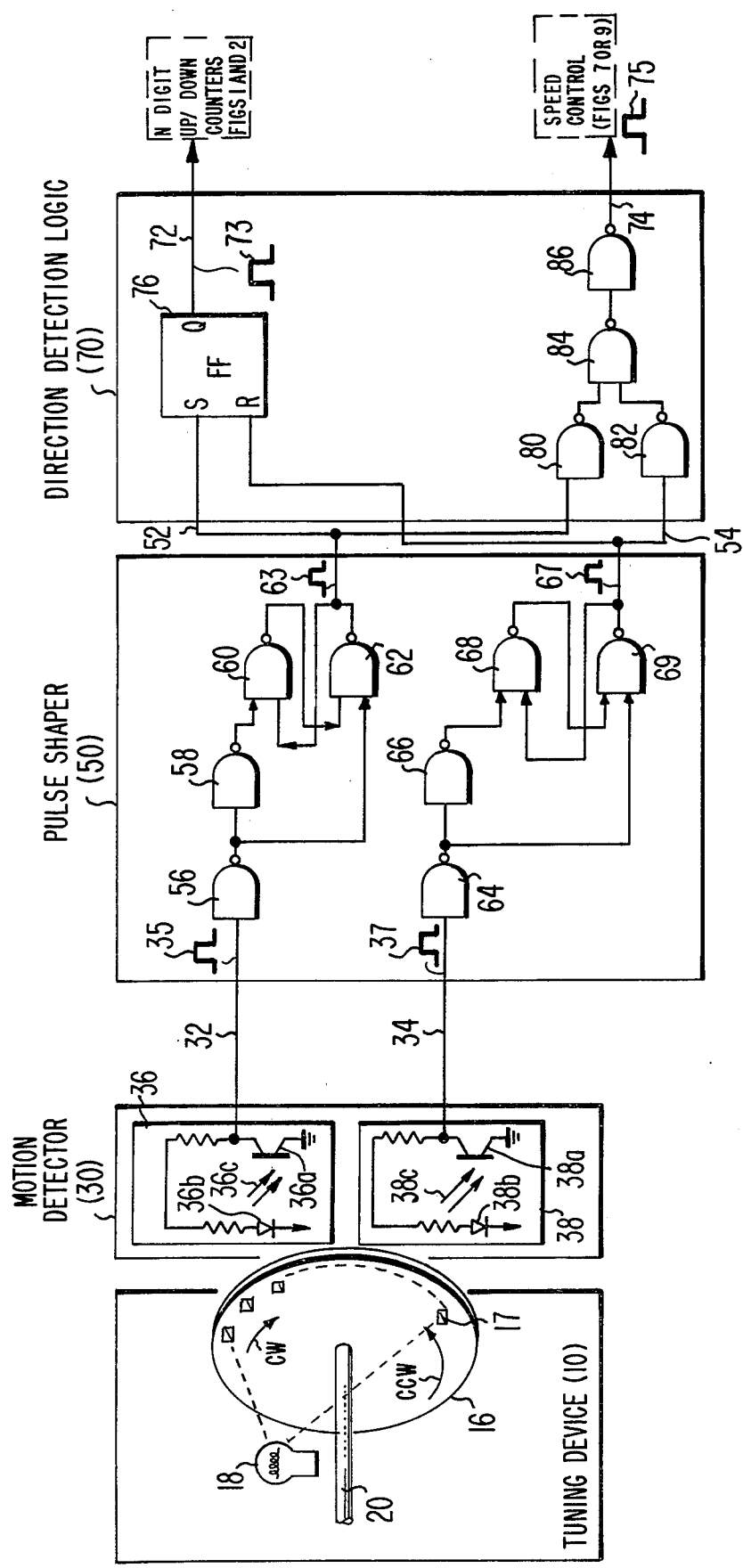
FIG. 6 is a detailed block diagram of portions of FIG. 1 showing the tuning device (10), motion detector (30), pulse shaper (50) and direction-detection logic (70)

Reference is now made to FIG. 6 for a detailed description of the tuning device 10, detector 30, shaper 50 and detection logic 70. Tuning device 10 includes a light source 18 which emits light onto disk 16. Disk 16 is rotated about shaft 20 by a manually operated knob, not shown. The emitted light is passed onto light detectors 36 and 38 through apertures 17 in disk 16. Disk 16 is moved in a clockwise or counter-clockwise direction in accordance with shaft 20. As disk 16 is rotated, it interrupts the light from light source 18 to optical isolators 36 and 38. The apertures 17 of disk 16 and the placement of optical isolators, in relation to the apertures, produce electrical signals that are phase related in accordance with the relative positions of the optical isolators 36 and 38. A 360 degree rotation of the disk with 100 apertures produces, as an example 100 pairs of electrically phase related signals 35 and 37. Optical isolators 36 and 38 are of conventional form having, respectively, a phototransistor 36a and 38a and a diode 36b and 38b, suitably arranged in a resistor network as shown, to generate an electrical signal (35, 37) in response to light energy 36c and 38c transmitted through the apertures 17 of disk 16.

The phase related signals 63 and 67, as indicated above, are generated by the rotation of disk 16 with detector (30) amplification and shaping by pulse shaper 50 (to be described later).

If signal 63 is generated before signal 67, the direction-detection logic 70 (to be described later) produces a zero voltage condition for signal 73 at the time of occurrence of clock signal 93. This phase relationship (see FIG. 4) occurs with a clockwise (cw) rotation of disk 16 as indicated by the arrow (cw) in FIG. 6. A zero voltage condition of signal 73 at the occurrence of clock signal 93 produces the up (increase) control to up/down counters 150. Similarly, if signal 67 occurs before 63, a positive voltage for signal 73 is generated by direction-detection logic 70, at the time of the occurrence of clock signal 93. This positive voltage condition of signal 73 is caused by a counter-clockwise rotation (cw) of disk 16 and generates a down (decrease) control to up/down counters 150.

Pulse shaper 50 may be provided to shape the output signals 35 and 37 of optical isolators 36 and 37 and provide some degree of amplification. Gates 56, 58, 60, and 62 suitably NAND gates (conventional TTL, for example) provide the shaping of signal 35 to produce signal 63. A conventional Schmidt trigger circuit, or equivalent may be used to implement the pulse shaper 50.

Similarly, NAND gates 64, 66, 68, and 69 provide the shaping of signal 37, to produce signal 67. However, the need for a pulse shaper is a design choice that is dependent on the type of motion detector 30 used, noting that relatively sharp waveforms (pulses) are needed to distinguish between clockwise and counter-clockwise rotation.

Direction-detection logic 70 (FIG. 6) performs two functions in practicing the present invention: it generates the up/down control signal 73 to up/down counters 150 and supplies control logic between the up/down control signal 73 and the clock signal 93.

Generation of the control signal 73 is accomplished through a flip-flop FF 76. FF 76 is set by the negative going edge 63a (FIG. 4) of signal 63 and reset by the negative going edge (67a) of signal 67. Thus, a positive voltage of signal 73 is established by the negative going edge of signal 63 setting flip-flop 76, which remains in that condition until the negative going edge of signal 67 occurs, producing a zero voltage condition. This zero voltage condition is present at the time of occurrence of clock signal 93 (FIG. 4) and is utilized by up/down counters 150 as an up (increase) control signal to increment the up/down counter 150 by one bit (clock pulse). The down (decrease) control on signal 73 is established by the negative going edge of signal 67 resetting flip-flop 76, which remains in that condition, until the negative going edge of signal 63 occurs, producing a positive voltage condition. This positive voltage condition is present at the time of occurrence of clock signal 93 (FIG. 4) and is utilized by up/down counters 150 as a down (decrease) control signal to decrement the up/down counters 150 by one bit (clock pulse).

Figure 4:
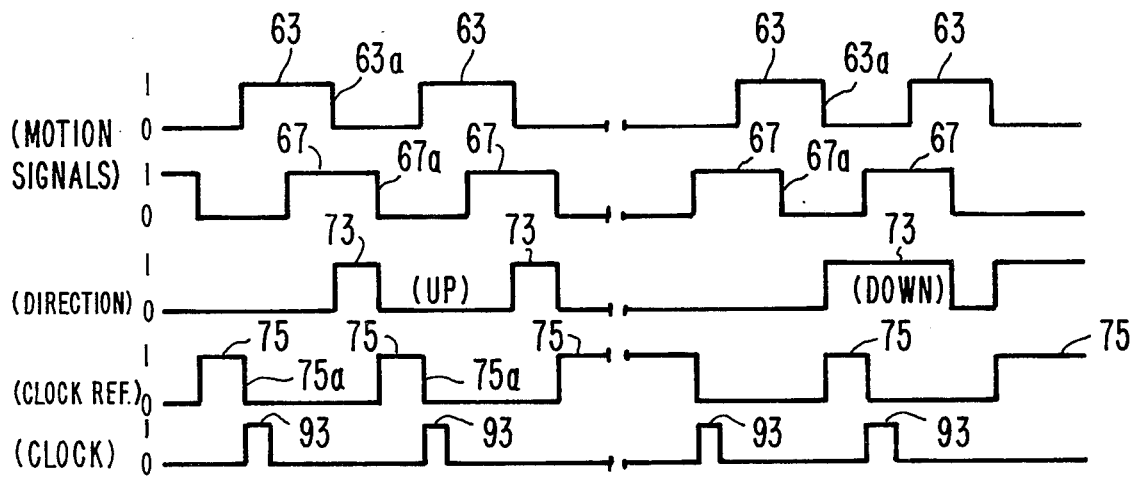
FIG. 4 is a timing diagram of the direction-detection waveforms associated with FIGS. 1, 2, and 3.
Figure 7:
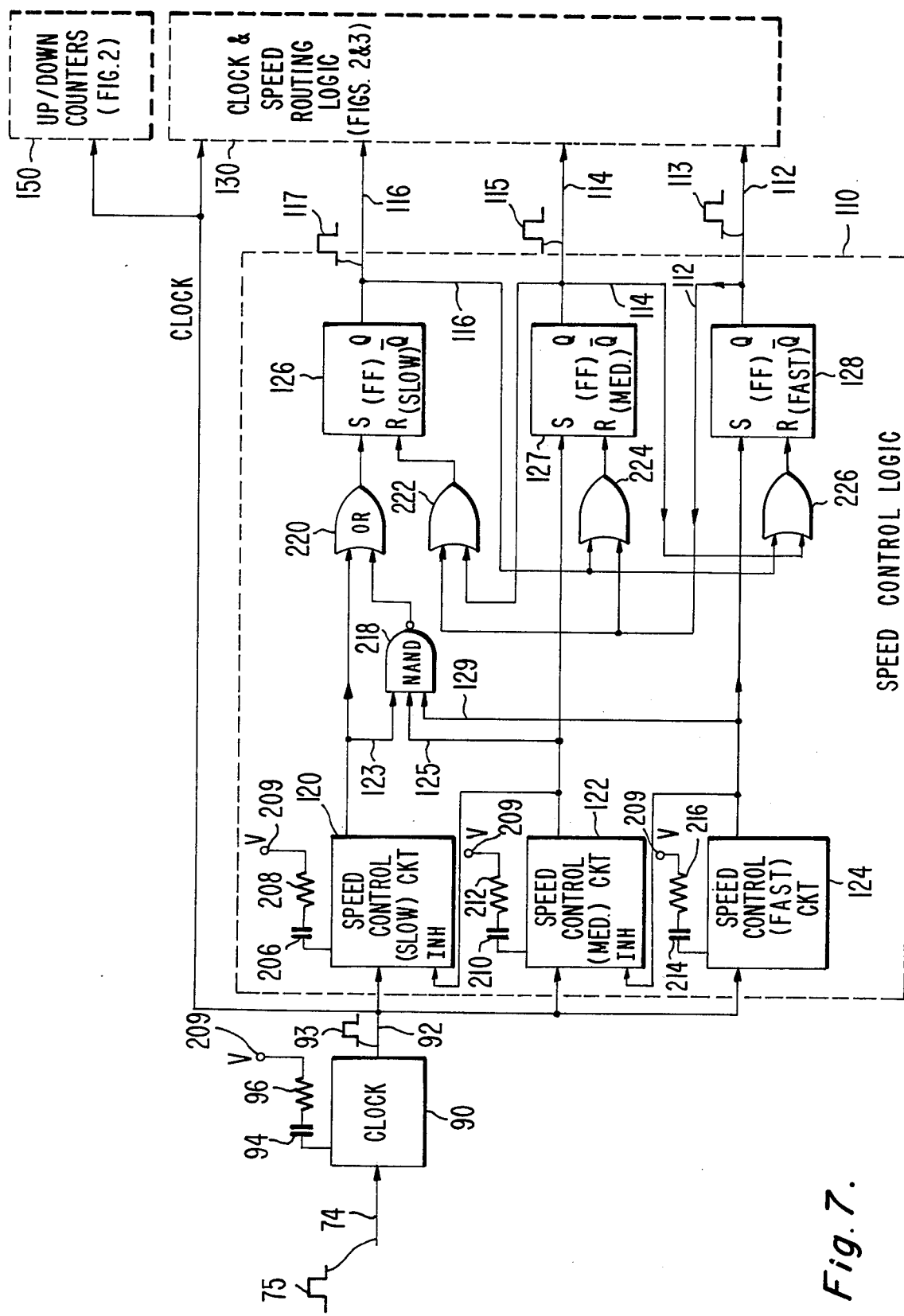
FIG. 7 is a detailed schematic of the clock (90) and speed control logic (110) of FIG. 1.

Reference is now made to FIG. 7. Clock signal 93 is generated by clock 90 in response to signal 75 from logic 70. The response time of clock 90 is controlled by the time constant of an R-C network (comprising capacitor 94 and resistor 96) coupled to a voltage source (v) 209. Signal 75 occurs whenever signals 63 and 67 are zero as shown in FIG. 4. The negative going edge (75a) of signal 75, it is noted, causes, and is, therefore, coincident with the leading edge of clock signal 93. Further, it is to be noted, signal 75 exists while disc 16 is not moving and thus clock signal 93 is generated only when movement of disk 16 occurs as manifested by the presence of detected signals 63 and 67. Thus, the rate of clock signals 93 is variable as a function of the relative rate of the detected signals 63 and 67 (FIG. 4). Clock signals 93 as indicated generally in FIG. 1, are bussed via signal path 92 (FIG. 7) to slow speed control circuit 120, medium speed control circuit 122, fast speed control circuit 124, clock and fast speed routing logic 134 (FIG. 2), clock and medium speed logic routing 132 (FIG. 2) and the (slow speed) up/down counter (1) 152 (FIG. 2). The repetition rate of clock signal 93, as will be explained, causes only one of the three speed control circuits 120, 122, 124 to be activated.

Control circuits 120, 122, and 124 are suitably conventional retriggerable one-shot circuits including an inhibit feature and an R-C time circuit to establish the time of operation. Each such one-shot may be a type CD 4047 series of the RCA Corporation.

Slow speed control circuit 120 will be enabled when the repetition rate of clock signal 92 is relatively slow, as for example, between 0 and 2 pulses per second (pps). Medium speed control circuit 122 will be enabled when the repetition rate of clock signal 92 is relatively faster, as for example, being increased to 3 pps. Fast speed control circuit 124 will be enabled when the repetition rate of clock signal 92 is faster, i.e., it exceeds 3 pps. As previously described, the rates of clock signal 93 are a function of the rotational rate of the tuning device 10, and the number of pairs of phase related signals 35 and 37 produced per revolution. The example previously stated is 100 pulse pairs 35 and 37 per 360 degree revolution. The clock pulses 93 corresponding to the rotational rate of the tuning device 10 are as follows: 2 pps are caused by a rotation rate of 1.2 rpm, 3 pps for 1.8 rpm, and 4 pps for 2.4 rpm.

The speed control signals (117, 115, and 113) are generated by the speed control logic shown in detail in FIG. 7. The clock signals 93 via clock bus 92 are coupled to the slow (120) medium (122), and fast (124) speed control circuits (CKTS) as previously indicated. Each circuit responds to the signals and according to the respective R-C circuits (206 208; 210 212; 214 216) one of these circuits will be enabled to the exclusion of the other two. The exclusion function is accomplished by coupling the output lead 129 of the fast speed control circuit 124 to the inhibit (INH) input of the medium speed control circuit 122 and the output lead 125 of the medium speed control circuit 122 to the inhibit (INH) input of the slow speed control circuit 120. The inhibit interconnections between 124, 122, and 120 establishes the respective priorities between these circuits. The fast circuit 124 has first priority. When it is active it prevents an output from medium circuit 122. Medium circuit 122 has second priority. When it is active it prevents an output from slow circuit 120. Thus, the speed control logic functions as a multiple position single pole switch that routes the pulse to the appropriate counter stage as a break-before-make switch, or exclusive "OR" circuit. Speed control circuits 120, 122, 124, correspondingly activate the SET(S) terminal of its associated flip-flop 126, 127, 128, respectively. The respective Q outputs of flip-flop 126, 127, and 128 are routed to clock and fast speed routing logic 134 and clock and medium speed routing logic 132 (FIG. 2) via signal paths 116, 114, 112, respectively. In effect, an exclusive OR circuit, to ensure only one speed control signal 117, 115, or 113 is present at a time, is implemented with gates 222, 224, and 226, suitably OR gates (FIG. 7). The Q output of flip-flop 126, via signal path 116, is routed to OR gates 224 and 226. The slow speed control signal 117 when active on signal path 116, resets flip-flops 127 (medium) and 128 (fast). The medium speed control signal 115 similarly resets fast speed control flip-flop 128 and slow speed control flip-flop 126 via signal path 114. Similarly fast speed control signal 113 resets slow speed control flip-flop 126 and medium speed control flip-flop 127 via signal path 112. Gates 218 and 220, suitably a NAND and OR gate, respectively, ensure that the first clock pulse 93 occurrence will be under control of slow speed control circuit 120. This is accomplished, it should be understood, because if the tuning device 10 is not being rotated, clock signal 93 will be zero. In this condition of no clock signal, speed control circuits 120, 122, and 124 are inactive with zero voltage present on signal paths 123, 125, and 129, respectively. Signal paths 123, 125, and 129 are coupled to NAND gate 218 which produces a logic 1 which, in turn, is coupled to OR gate 220. OR gate 220 sets flip-flop 126, which in turn, resets flip-flops 127 and 128. In this quiescent condition, slow speed control signal 117 is coupled to clock and fast speed routing logic 134 and clock and medium speed routing logic 132 via signal path 116, thus placing the apparatus in a slow mode speed control as will be explained.

Reference is now made to FIG. 2 showing clock and speed routing logic 130 and the six decade up/down counters 150. Clock and speed routing logic 130 is formed of clock and medium speed routing logic 132 and clock and fast speed routing logic 134. Clock and medium speed routing logic 132 is interconnected between the least significant bit (LSB) up/down counter (1) 152 and up/down counter (2) 154 via signal paths 153. The clock lead 92 is preferably inhibited from incrementing counter 152 unless AND gate 152a is enabled by the slow speed signal 117. Thus, the LSB counter is not altered during the medium and fast modes. Path 153a is used for the two-speed mode in conjunction with FIGS. 8 and 9 to be described hereinafter. Clock and fast speed routing logic 134 is interconnected between up/down counter (3) 156 and up/down counter (4) 158 via signal paths 157 and 135. Each of the clock and speed routing logic (132 and 134) acts as enable/inhibit logic bertween one stage and an adjacent stage of the up/down counters 150. When any one of the two clock and speed routing logics 130 is activated, it will enable clock signal 93 to the higher order up/down counter stage and inhibit the lower order stage from the higher order stage.

The contents of each of the counters of counter stage 150 are coupled by counter carry over logic via paths 184–194 forming logic bus 195, to the associated display 172, 174, 176, 178, 180, and 182 corresponding to any control parameter, but for example, here, a frequency of 100 Hz, 1.0 kHz . . . , to 10 MHz as shown. The display is of any suitable form including means to convert the binary contents of the counter 150 into decimal form whereby the display 170 represents the instantaneous frequency in digital form as shown. However, the display may be in any format such as binary, octal, or hexadecimal format, if desired.

Figure 3:
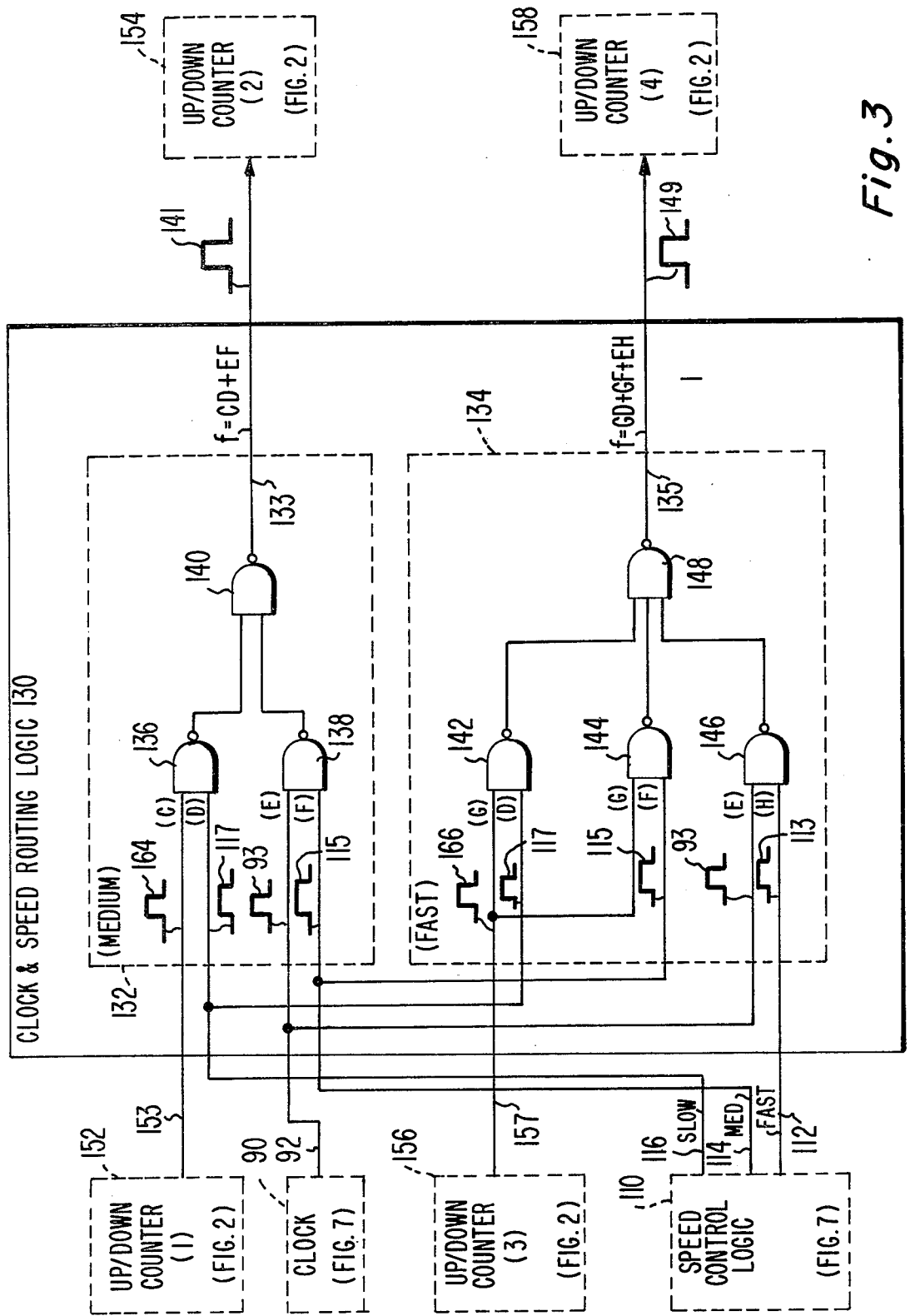
FIG. 3 is a detailed schematic of the clock routing logic of FIGS. 1 and 2.

Reference is now made to FIG. 3 showing in detail the clock and speed routing logic 130. Clock and medium speed routing logic (medium) 132 is formed of gates 136, 138, and 140, suitably NAND gates. The output signal 141 of NAND gate 140 is coupled to up/down counter 154 via signal path 133. The Boolean expression for signal 141 is $f = CD + EF$. The Boolean logic variables C and D enter NAND gate 136 via signals 164 and 117, respectively. Variables E and F enter NAND gate 138 via signals 93 and 115, respectively. Signal 141 will be active when both signals 164 and 117 to NAND gate 136 are simultaneously active or both signals 93 and 115 to NAND gate 138 are simultaneously active. Signal 117 is the output of the slow speed control flip-flop 126. When (slow) signal 117 is active, signal 141 is representative of the overflow output of the LSB up/down counter 152 via signal path 153. Signal 115 is the output of the medium speed control flip-flop 127. When (medium) signal 115 is active, signal 141 is representative of the clock signal 93. As previously explained, signals 115 and 117 are mutually exclusive, and therefore, are never present at the same time. Therefore, clock and speed routing logic 132 provides up/down counter (2) 154 with signal 141 representative of the LSB signal 164 (output of the lower stage counter) when slow speed control circuit 120 is active and signal 141 is representative of signal 93 when medium speed control circuit 122 is active. Clock and speed routing 134 operates essentially the same as logic 132. The output signal 149 of NAND gate 148 is coupled to up/down counter (4) 158 via signal path 135. The Boolean expression for signal 149 is f=GD+GF+EH. Variables G and D enter NAND gate 142 via signals 166 and 117, respectively. Variables G (also connected to NAND gate 142) and F (also connected to NAND gate 138) enter NAND gate 144 via signals 116 and 115, respectively. Variables E (also connected to NAND gate 138) and H enter gate 146 via signals 93 and 113, respectively. The signal 149 is representative of clock signal 93 when fast speed control signal 113 is active and signal 149 is representative of the lower stage up/down counter (3) 156, via signal 166, when speed control slow signal 117 or speed control medium signal 115 is active. Clock and speed routing logic 130 provides a system whereby in a speed control slow mode, clock signal 93 (least significant bit) is routed to the first stage of the up/down counter; in a speed control medium mode clock signal 93 is routed to the second stage; and; lastly in a speed control fast mode clock signal 93 is routed to the fourth stage. The stages associated with the medium and fast controls may be modified as desired by arranging the clock routing logic between the desired up/down counter stages.

Figure 5:
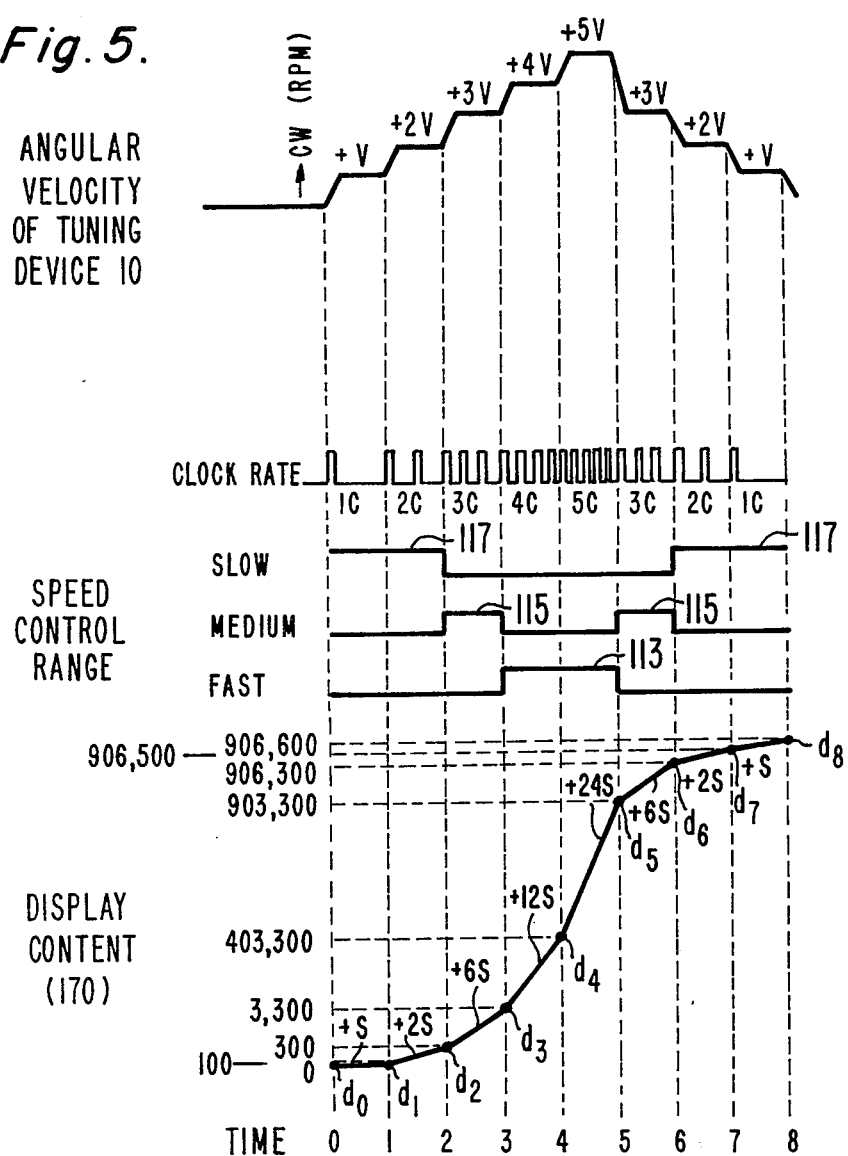
FIG. 5 is a waveform diagram of various clock speed signals and the associated speed control signals used in FIGS. 1, 2, and 3.

FIG. 5 illustrates the waveforms, etc. to understand the overall operation of the invention. Shown in FIG. 5 are angular velocity (revolution per minute) of tuning device 10, clock rate (pulses per second), speed controls (slow, medium, fast) and display contents. To simplify the explanation, it will be assumed that the rate of change of movement of the tuning device 10 is increased and decreased linearly. In practicing the invention in an environment wherein the device 10 is a component of a servo loop or the like and is moved by automatic equipment, such as a motor or synchro, for example, the movement of the device can, indeed, be linear. However, it should be realized that an operator rotating the tuning device usually does not move or rotate a tuning device in a strictly linear sense. Nevertheless, according to the invention, the clock rate generated by the movement of the tuning device is directly proportional to the rate of change of movement and furthermore will vary as the rate of change is varied. Thus, increases in the rate of movement increases the clock rate, and decreases in the rate of movement, decreases the clock rate. As the clock rate is increased such as to reach predetermined values corresponding, respectively, to each of the preselected speed ranges, the speed control signals (117, 115, 113) generated by speed control logic 110 are progressively sequenced. Similarly, as the clock rate decreases the speed control signals are sequenced from fast, to medium, to slow. The instantaneous display (170) contents is a function of the clock rate (93) and the range of the speed control (fast, medium, or slow). When the apparatus is in the slow speed control mode, the clock rate slowly changes the display contents. As the clock rate is increased, it sequences the speed control to the medium mode, and the display contents changes at a faster rate. A still further increase in the clock rate causes the speed control to sequence to the fast mode, and the value of the display contents changes rapidly. Typical values shown in FIG. 5 are tabulated in Table I below assuming a substantially ideally linear change in movement of the tuning device as explained above.

TABLE 1

| (1) ANGULAR VELOCITY OF MOVEMENT OF TUNING DEVICE 10 (R.P.M.) (V) | (2) CLOCK RATE (C) (93) (PULSES PER SECOND) | (3) RELATIVE SPEED CONTROL RANGE | (4) DISPLAY CONTENTS SLOPE (S) |
| --- | --- | --- | --- |
| +V (0.6 rpm) | C (1.0 pps) | slow (117) | +S |
| +2V (1.2 rpm) | 2C (2.0 pps) | slow | +2S |
| +3V (1.8 rpm) | 3C (3.0 pps) | medium (115) | +6S |
| +4V (2.4 rpm) | 4C (4.0 pps) | fast (113) | +12S |
| +5V (3.0 rpm) | 5C (5.0 pps) | fast | +24S |
| +3V (1.8 rpm) | 3C (3.0 pps) | medium | +6S |
| +2V (1.2 rpm) | 2C (2.0 pps) | slow | +2S |
| +1V (0.6 rpm) | 1C (1.0 pps) | slow | +S |

The columns of Table 1 are (1) angular velocity of tuning device 10 given in revolutions per minute (R.P.M.); (2) clock rate (C) 93 given in pulses per second (p.p.s.); (3) relative speed control range given in speeds that are slow (117), medium (115) and fast (113); and (4) display contents specified in terms of a slope (S) to be explained.

Table 1 lists examples of five different angular velocities (V) of tuning device 10, namely V (0.6 rpm); 2 V (1.2 rpm); 3 V (1.8 rpm); 4 V (2.4 rpm); and 5 V (3.0 rpm). The + sign signifies clockwise roation of tuning device 10. Assuming the tuning device 10 is rotated at the respective velocities, rotation of device 10 at 4 V (2.4 rpm) causes a clock rate (93) of 4C, namely, 4.0 pps. Clock rates C and 2C are manifested in the relatively slow (117) range of speed control, 3C as medium (115) and 4C and 5C as fast (113). Column (4) of Table 1, is the value of the N-Digit Display 170 given in terms of increasing rates, specified in terms of relative slopes +S, +2S, +6S, +12S, +24S. The term "slope" for the present description is merely indicative of the rate of change of the frequency manifesting the rate of change of the tuning device and likewise the rate of change of the contents of display.

The contour of the rate of change of the contents of display 170, shown on FIG. 5, illustrates the typical values given in Table 1. The time base (eight seconds) of the contour is shown at the bottom of FIG. 5. The incremental times shown, 0, 1, 2, 3, 4, 5, 6, 7, 8, intersect the curve of the rate of change of display contents (170), the speed control range, clock rate, and angular velocity of tuning decive 10, at the dashed vertical lines shown to provide a direct relationship of each during the sequence of the exemplary tuning operation. Intersectional points of the incremental times with the contour of the rate of change of the contents of display (170), are shown as $d_0$–$d_8$, corresponding to times 0–8, respectively. The contour of the rate of change of the contents of display 170 is segmented according to the respective slopes S, +2S, +6S, +12S, +24S, +6S, +2S and S corresponding to changes in the contents of display 170 from points $d_0$–$d_1$, $d_1$–$d_2$, $d_2$–$d_3$, $d_3$–$d_4$, $d_4$–$d_5$, $d_5$–$d_6$, $d_6$–$d_7$, $d_7$–$d_8$, respectively. The ordinates of intersectional points $d_0$–$d_8$, are the display contents values of 0; 100; 300; 3,300; 403, 300; 903, 300; 906, 500; 906, 600; respectively. These display contents values are derived by the interaction of the angular velocity of tuning device 10, clock rate 93, and speed control range as explained above. The clock rate, it should be appreciated, is "adaptive" since it is dependent on the instantaneous movement of the tuning device 10. The clock rate is thus directly dependent on the angular velocity of device 10; increasing the angular velocity from velocity V to 2V, 3V, 4V, 5V, causes the clock rate to increase from clock rate C to 2C, 3C, 4C, 5C, respectively. Clockwise (c.w.) direction of the rate of movement increments the display contents 170 and similarly counter-clockwise (c.c.w.) direction (not shown) decrements the contents.

The contour of the change rate of contents of display 170 is represented in linear segments to simplify the explanation. Furthermore, the 8-second time base is a typical, not exact time. The time will vary with the operator.

For illustrating the operation of the apparatus, the contour of the contents change of display 170 indicates the initial movements of tuning device 10 as its angular velocity increases, which, in turn, causes the speed control to sequence from slow 117, to medium 115, to fast 113. As the desired frequency is approached, the angular velocity is decreased sequencing the speed control from fast 113 to medium 115. Finally, as the angular velocity is further decreased to sequence the speed control from medium 115 to slow 117, the speed mode will remain in this slow-mode condition until the desired frequency is obtained as the tuning device 10 is rotated slowly.

For the example shown in FIG. 5, when the apparatus is at an at-rest condition, the display content 170 is 0. As the tuning device 10 is rotated in a clockwise direction at the angular velocity of +V (0.6 rpm) for one second, a clock rate of C (1 pps) is generated to increment the least significant bit (LSB) up/down counter 152 by one bit to produce a count of 100 in the N Digit display 170. This corresponds to point $d_1$ on the contents contour. The LSB (152) is incremented because the apparatus is in slow speed control (117) mode. Further increasing the angular velocity +2 V (1.2 rpm) for another second causes a clock rate of 2C (2 pps) to increment the display contents by two additional LSB's obtaining a value of 300 corresponding to point $d_2$. The LSB is incremented, it should be noted, because the slow speed mode of control 117 is still active by the continuing rotation of tuning device 10. When the angular velocity is increased to +3 V (1.8 rpm) for another second a clock rate of 3C (3 pps) is produced causing the speed control range to sequence from the slow (117) to medium (115) mode. In the medium speed control mode, the clock is shifted from the LSB up/down counter 152 to up/down counter 154, whereby the clock of 3 pps increments the display 170 by a count of 3,000 resulting in the sum of 3,300 as indicated by point $d_3$. Further, increasing the angular velocity of tuning device 10 to +4 V (2.4 rpm) for the fourth second produces a clock rate 4C (4 pps) causing the speed control to sequence from medium 115 to fast 113. The clock is shifted from up/down counter 154 to up/down counter 158, whereby the clock rate of 4 pps increments the display contents 170 by a count of 400,000, to produce a total sum of 403,300 as at point $d_4$. In this condition of fast speed control 113, increasing the angular velocity of tuning device 10 from +4 V (2.4 rpm) to +5 V (3.0 rpm) for the fifth second increments the display contents 170 by 500,000, to produce a sum total of 903,300 at point $d_5$. On continuing rotating the device 10 for the sixth second, the angular velocity of movement is decreased from +5 V (3.0 rpm) to +3 V (1.8 rpm), producing a clock of 3C (3 pps), causing the speed control to sequence down from fast 113 to medium 115. The clock (3 pps) is shifted from up/down counter 158 to up/down counter 154 incrementing the display 170 by a count of 3,000 to produce a total sum of 906,300 as at point $d_6$. Then as the angular velocity is further decreased to +2 V (1.2 rpm) for the seventh second, producing a clock rate of 2C (2 pps), the speed control is sequenced down from medium 115 to slow 117. The clock (2 pps) is accordingly shifted from up/down counter 154 to LSB up/down counter 152, to increment the display contents 170 by a count of 200, to produce a total sum of 906,500 as at point $d_7$. At this point as the desired frequency (906,600) is being approached, the angular velocity is decreased to V (0.6 rpm) for the final, or eighth second producing a clock rate of C (1.0 pps). Slow but continuous movement of device 10 keeps the speed control in the slow (117) mode active. The clock rate (1 pps) increments the display contents 170 by a count of 100, producing the desired frequency of 906,600 as at point $d_8$. The desired frequency tuning have been achieved, the tuning device 10 is no longer rotated whereby the angular velocity returns to 0 and the contents of the display 170 remains at the last value achieved while the device was in motion. Suitable means are provided (not shown) to hold, transfer or otherwise reset the apparatus for a new tuning operation.

Figure 8:
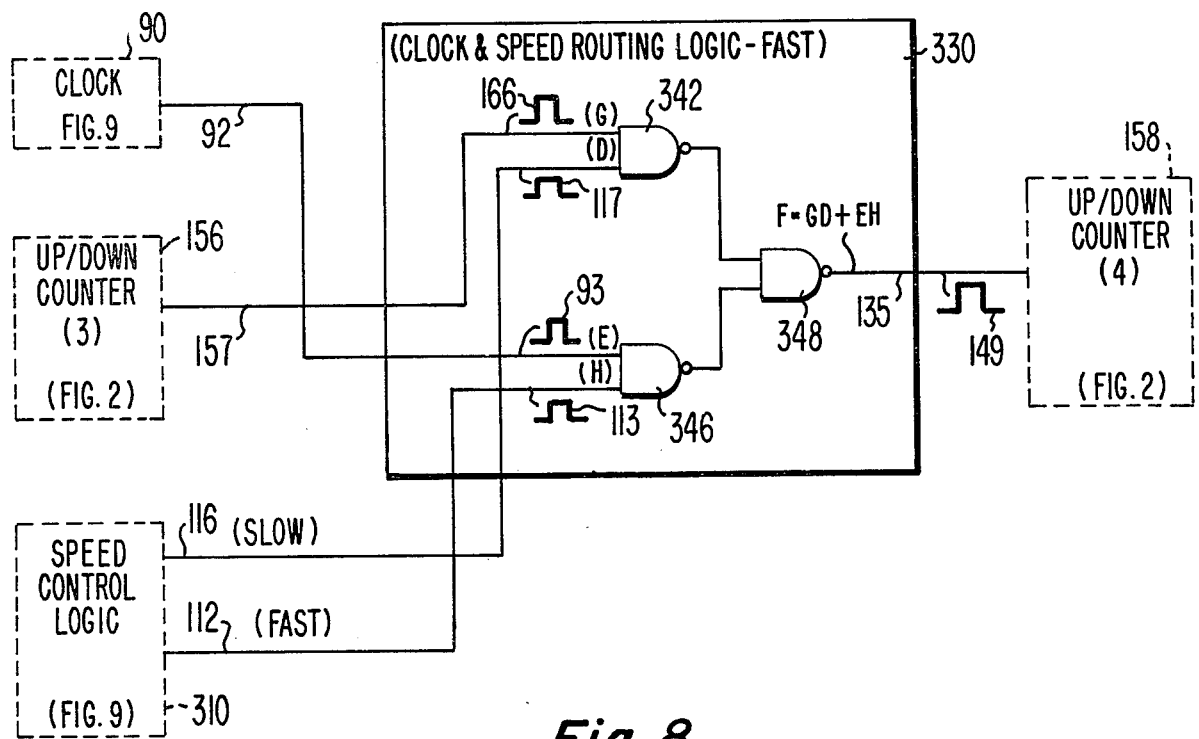
FIG. 8 is a modification of the embodiment illustrated in FIG. 3 providing for a two-speed operation mode.
Figure 9:
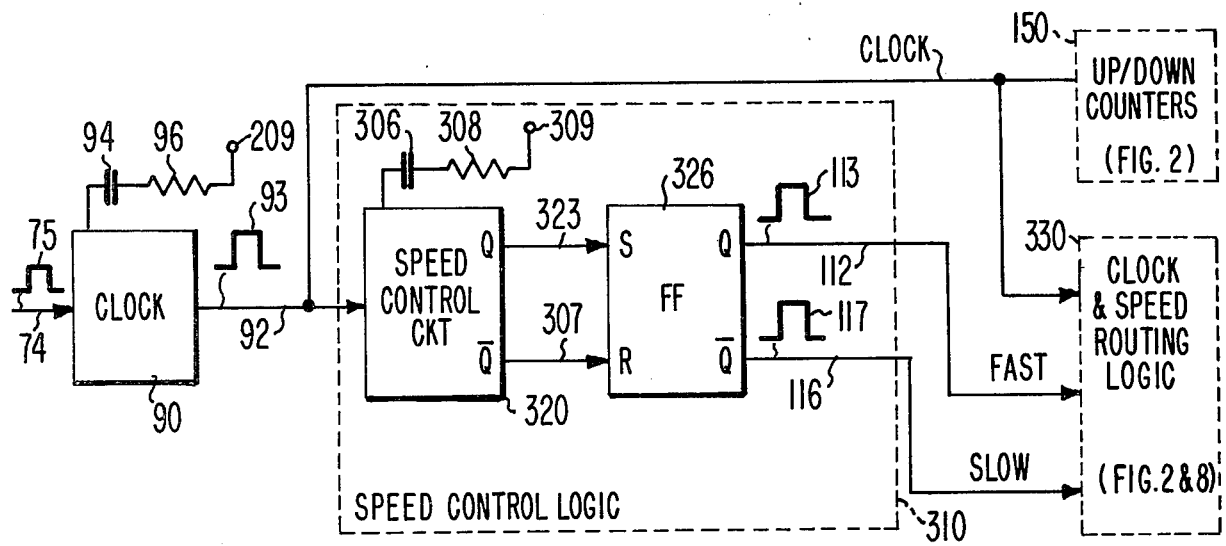
FIG. 9 is a modification of the clock and speed control logic of FIG. 7 providing for the two speed mode of operation.

Refer now to FIGS. 8 and 9 for the logic arrangement of a speed control system modified to handle only two modes of speed control, namely a slow and fast mode. According to this embodiment, the medium mode is eliminated. It should be appreciated that even though the circuit is simplified to provide only two modes of speed control, the tradeoff involves a compromise of the manipulation of the tuning device 10 required in order to go from a slow to a fast mode whereby the achieved or desired frequency may not be as rapid as for the embodiment utilizing the "medium" mode. As indicated hereinabove, the overall system diagram of FIG. 1 is arranged by dotted lines, to show that the medium speed control path is optional. Similarly, in FIG. 2, the clock and speed routing logic 132 is in dotted lines for the optional "medium" mode.

Referring now to FIG. 9, there is shown in block diagram form the modification of the speed control logic of FIG. 7. In this arrangement also the clock 90 provides the clock pulses 93. The clock pulses 93 are coupled to the input of a suitable one-shot 320, generating in response to the clock pulses 93 output signals over paths 323 and 307, respectively, coupled to the S and R inputs of a flip-flop 326, which in turn, provides its outputs to the clock and speed routing logic 330 (FIG. 8) via leads 112 carrying the fast control signal 113 and lead 116 carrying the slow control signals 117. In addition, the clock pulses are coupled similarly, as in FIG. 7, to the up/down counters 150 of FIG. 2 and the clock and speed routing logic 330 of FIG. 8. Flip-flop 320 is provided with an RC-network comprising resistor 308 and capacitor 306 connected to a voltage source 309. The arrangement of the RC-circuit depends upon the timing limits that are to be provided. Thus, the RC-timing network functions as a timing filter to discriminate against the fast and slow clock pulses as the rate of the clock changes with the manipulation of the dial 10. Typically, the RC-network will be the same or similar to that of FIG. 7 comprising the resistor 216 and capacitor 214 for the fast control device 124.

Refer now to FIG. 8 in which the clock and speed routing logic 130 (FIG. 3) has been modified to provide for the two speed mode of operation. The respective outputs of the control leads 112 and 116 from speed control logic of FIG. 9, just described, are coupled to the respective logic H and D inputs of a pair of NAND gates 342 and 346. The respective other inputs to the two input NAND gates are derived from the clock 90 via path 92 as the logic E input to gate 346 while the ouput of the (3) digit up/down counter 156 is coupled to the other logic input G. It should be appreciated that the division of the fast from the slow mode of control is a matter of choice and as seen from FIG. 2 the binary position of the count that represents the desired frequency or display can be interconnected as the needs of the system dictate. In the present embodiment only the three most significant counters are coupled to the high speed mode while all the preceding counter bits or digits are coupled to the slow speed of control. The respective outputs of NAND gates 342 and 346 are coupled to a two input NAND gate 348 that provides the Boolean logic computation indicated on the output lead 135. The output of NAND gate 348 is the count signal 149 which is the input to the up/down counter of the fourth digit namely counter 158 shown and described above with respect to FIG. 2.

The operation of the two mode system providing the slow and fast modes only, is substantially the same as that described above for the three-speed mode with the exception that the medium mode is no longer used. While the tuning device 10 is rotated in either direction, the system is operative. The rate of movement of the tuning device 10 determines the clock rate from clock 90 as described above, the rate of speed movement being discriminated by the speed control circuit one-shot 320 of logic 310 (FIG. 9). Thus, when the dial is rotated at a rate which generates pulses above three pulses per second, one-shot 320 transfers the speed control such that the output of flip-flop 326 is the fast signal 113 to thereby cause routing logic 330 to clock the fourth position up/down counter 158. When the fourth counter 158 is incremented, the lower order counters will remain at the last count prior to the fast mode transfer. In all other respects, the operation of the two speed mode system as compared to the three speed mode system is substantially the same.

In summary, the operator rotates the tuning device 10 and thus disk 16 at a rate that will, within the limits of human skills, achieve the desired frequency. Thus, a quick or rapid rotation of the disk 16 will cause a fast clock signal 93 resulting in possibly a frequency selection in the 1–10 MHz band as would be manifested by a frequency display in display 180 (FIG. 2). If the tuning rate is faster, it will tune to the 10–100 MHz band as indicated by display 182. Similarly, if the disk 16 is rotated very slowly, the frequency selected will be quite low, for example, in the 100 to 999 Hz range as displayed by display 172. Thus, any frequency in the range of the apparatus may be quickly achieved with the proper manipulation and movement of the tuning dial 16. It should be noted that no changes in the frequency will occur unless the dial 16 is moving.

The invention as described is preferably embodied using a disk that provides optical signals to the motion detector 30. In a modified form of the invention, the disk 16 may be provided with magnetic devices that are sensed by magnetic sensing devices, generating signals comparable to singals 35 and 37 for similar processing thereafter. A suitable magnetic disk structure is illustratd in FIG. 4 of the aforementioned U.S. Pat. No. 3,665,323, and may be substituted for the optical arrangement illustrated in FIG. 6 following the principles explained hereinabove.

The apparatus of the invention is applicable to a wide range of uses. Thus, the counter 150 may establish the digits of controlled device such as a frequency synthesizer as well as simultaneously energizing a digital display. The invention may be used, for example, in a receiver, the counters 150 providing the frequency selection range of the receiver. In another use, the tuning device 10 may take the form of a shaft in a digital process control, replacing geared controls or multi-turn potentiometers.

A still further use is for switching the display of a tachometer so that only the most significant bits will be displayed.

While the embodiments described utilize a rotatable device 10, it will be appreciated that any form of moveable device may be used as the manually operative member. Suitably sensing means, in optical, electrical or magnetic form can be arranged to provide the signals indicative of the movement of such a device.

Furthermore, while the embodiment described provides for means to sense or detect the direction of movement of the device, certain applications may involve only uni-directional movements. Accordingly, the embodiment described can be suitably modified to handle such uses. Thus, for example, only one motion detector, such as detector 36 or 38 (FIG. 6) is needed, the output of such a single detector being coupled directly to clock 90 (FIGS. 7 or 9) and to the up/down control of the counters (FIGS. 1, 2) as an invariant control signal. If desired, the counter may simply be incrementing or decrementing type counters with suitable reset functions.

As has been indicated, tuning device 10 may be positioned by appropriate means automatically, for example, in a closed-loop servo system. FIG. 1 illustrates a system to accomplish such remote positioning utilizing a controlled device 170a such as a frequency synthesizer, a comparator 170b, a presettable control 170c, and a digital to analog converter 170d. Controlled device 170a is the equipment that will be remotely positioned to a desired operating value or condition. To accomplish the desired value, automatic positioning, rather than manual manipulation of device 10, comparator 170b, presettable control 170c and digital to analog converter 170d are employed to achieve the automatic control operations.

In brief, the system operates to compare the actual digital values of the controlled device 170a with the desired digital values of presettable control 170c. If the actual and desired values are not equal, the tuning device 10 is moved automatically at a rate and direction until the comparison is accomplished.

The desired value or operating condition of the controlled device is preset into presettable control 170c. For example, the value illustrating the use of the "manual" controlled embodiment (FIG. 5) of 906, 600 may be the value preset to control 170c. The actual operating value of device 170a is determined by the state of the up/down counters 150 via bus 195a, which is in parallel with bus 195 as described hereinabove. The actual value of controlled device 170a is coupled to comparator 170b as digital information over bus 196 which may be parallel to buses 195 and 195a or may, indeed, be the output indication of the state of the controlled device. The desired value in the presettable control 170c is coupled to the comparator 170b as digital information over bus 197. The comparator 170b compares the desired value with the actual value and develops an error signal on bus 198. The error signal developed contains the information to provide a fast, medium, or slow mode of operation. The determination of which mode the system should operate in may be achieved by any suitable logic circuit. Such a logic circuit may first compare the higher order bits of the actual value with high order bits of the desired value and if they do not compare generate an error signal for a fast mode of operation. If the comparison of the higher bits is satisfied, then the comparator 170b will compare middle order bits of the actual and desired values and if they do not compare, generate an error signal for the medium mode of operation. If the comparison of the middle order bits is satisfied, then the comparator 170b compares the least significant bits of the actual and desired values and if they do not compare generate an error signal for the slow mode of operation. If the comparison of the least significant bits is satisfied, then the comparator 170b will generate a signal placing the system in an at-rest condition. Representative values of the above bits are the higher order bits contained in up/down counters 158, 160, and 162, middle order bits contained in up/down counters 156 and 154, and the least significant bits contained in up/down counter 152. The error signals for the fast, medium, slow modes, developed by comparator 170b are coupled to digital-to-analog converter 170d via signal path 198. This error signal is decoded by appropriate logic of the digital to analog converter 170d to determine what speed, fast, medium, or slow the tuning device 10 should be moved. The digital-to-analog converter 170d contains appropriate analog circuits, to derive a drive voltage in accordance with the commanded speed mode, fast, medium, or slow. The fast command will be interpreted by appropriate analog circuits, to generate a voltage to a motor, connected via path 199 to the shaft of tuning device 10, which slews the motor and therefore tuning device 10. The medium command will be interpreted by appropriate analog circuits, to generate a voltage that will cause movement of the motor and therefore tuning device 10 at a lower speed than the slew (fast) voltage. Furthermore, the slow command will be interpreted by appropriate analog circuits, to generate a low voltage that will cause movement of the motor and therefore tuning device 10 at a slow speed. The slow speed of tuning device will be maintained until the actual value of controlled device 170a and the desired value contained in presettable control 170c are equal, whereby at this condition of equal values comparator 170b will develop an error signal of zero, which in turn will be interpreted by the analog-to-digital converter 170d as a command to place the tuning device 10 in an at-rest condition.

Analog-to-digital converter 170d is of a conventional type containing the appropriate analog circuits to function as a closed-loop system. The design of the analog-to-digital converter 170d incorporates appropriate feedback techniques for the driving element, e.g., motor, to provide for smooth rotation of the shaft of the tuning device 10 and prevention of overshoots as the speed is sequenced from fast (slew), medium, slow and zero (null). The servo control is a type I control system in which a constant error signal causes a constant output velocity in the steady state. Presettable control 170c, as well as comparator 107b, may be implemented in a computer such as a microprocessor or the like. The desired movement or series of movements of the device 10 is thus programmable to meet the needs of a processing control utilizing a device 10 or its equivalent.

It should now be appreciated, according to the invention, that a single tuning device provides for continuous tuning of tunable or adjustable equipment utilizing digital control signals. The movement of only one control performs the complete tuning or adjusting operation.

What is claimed is:

1. Apparatus for detecting the movement of a moveable device comprising;
    a. means associated with said device to detect movement of said device to generate a signal indicative of said movement;
    b. means responsive to said movement signal to generate a train of clock pulses having a rate corresponding to the rate of movement of said device;
    c. means responsive to said clock pulses to generate a speed signal indicative of one range of a plurality of preselected ranges of said clock pulses; and
    d. counter means responsive to said clock pulse and said speed signal to provide a count that manifests the displacement of said moveable device and the rate of movement at which said device is moved.

2. Apparatus according to claim 1 wherein said movement detection means further includes means for generating a second signal indicative of said movement, the occurrence of said first mentioned movement indicative signal before said second signal being indicative of one direction of movement and the occurrence of said second signal before said first mentioned signal being indicative of the other direction of movement of said device.

3. Apparatus according to claim 2 wherein said counter means includes up/down counter means, and further comprising:
    means responsive to said first mentioned movement indicative signal and said second signal to enable said counter means to count in a direction depending on the direction of movement of said device.

4. Apparatus according to claim 1 wherein said moveable device is rotatable and comprises a shaft, said shaft including a plurality of position indicating elements being angularly displaced on said shaft from each other.

5. Apparatus according to claim 4 wherein said movement detector means includes a first optical indicator and a second optical indicator positioned respectively to sense optically relative movement of said plurality of elements as said shaft is rotated, said elements comprising means to provide optical signals to said indicators.

6. Apparatus according to claim 4 wherein said motion detector means comprises a magnetic source activated by a plurality of substantially equally spaced bar magnets mounted on said shaft, and a first magnetic indicator and a second magnetic indicator positioned respectively to sense magnetically relative movement of said equally spaced bar magnets as said shaft is rotated.

7. Apparatus according to claim 1 wherein said detection means includes first logic gate means responsive to said movement signal to generate a first signal indicative of a first direction when a first signal is generated before generating a second signal and wherein a second direction signal is generated when said second signal is generated before said first signal.

8. Apparatus according to claim 7 wherein said detection means further includes second logic gate means responsive to said first and second signals for generating said clock pulses, said second logic gate means generating said clock pulses in response to the presence of both of said first and second signals.

9. Apparatus according to claim 8, wherein second logic gate includes means for generating said clock pulses in response to the absence of both of said first and second signals.

10. Apparatus according to claim 1, further comprising:
automatic positioning means responsive to said count of said counter means to generate a movement signal that is indicative of one range of a plurality of ranges that manifests the displacement of said moveable device and the rate of movement at which said device is moved from a predetermined position for automatically positioning said moveable device to said predetermined position.

11. Apparatus according to claim 10, wherein said automatic positioning means comprises a comparator having one input derived from said counters, another input derived from a presettable means, for generating thereby said movement signal for positioning said moveable device to a position corresponding to said predetermined position.

12. Apparatus according to claim 1 wherein said moveable device is a tuning knob of a frequency tunable device, and further comprising means responsive to the count of said counter means for providing an input control signal for a frequency synthesizer.

13. A method of detecting the movement of a moveable device comprising the steps of:
a. detecting movement of said device for generating a signal indicative of said movement;
b. generating in response to said movement signal a train of clock pulses having a rate corresponding to the rate of movement of said device;
c. generating in response to said clock pulses a speed signal indicative of one range of a plurality of preselected ranges of said clock pulse rate; and
d. generating in response to said clock pulses and said speed signal, count signals that manifest the displacement of said moveable device and the rate of movement at which said device is moved.

14. A method as set forth in claim 13 wherein said detecting step further includes;
generating a second signal indicative of said movement; and
comparing the occurrences of said first mentioned movement indicative signal and said second signal, the occurrence of said first mentioned signal before said second signal being indicative of one direction and the occurrence of said second signal before said first mentioned signal being indicative of the other direction of movement of said device.

15. A method as set forth in claim 14 wherein said generating count signals step includes up/down counting, and further includes the step of enabling counters prior to said generating step in response to said direction signals to count in a direction depending on said direction signals.

16. A method as set forth in claim 14 wherein said detecting step includes sensing optically relative movement of a plurality of elements on a rotating shaft to provide optical signals to a first optical indicator and a second optical indicator positioned respectively about said shaft.

17. A method as set forth in claim 14 wherein said detecting step includes sensing magnetically a magnetic source activated by a plurality of substantially equally spaced bar magnets mounted on a rotating shaft to provide magnetic signals to a first magnetic indicator and a second magnetic indicator positioned respectively about said shaft.

18. A method as set forth in claim 14 wherein said detecting step further includes generating said clock pulses in response to the presence of both of said first and second directional signals.

19. A method as set forth in claim 18 wherein said detecting step further includes generating said clock pulses in response to the absence of both of said first and second directional signals.

* * * * *

UNITED STATES PATENT AND TRADEMARK OFFICE
CERTIFICATE OF CORRECTION

PATENT NO. : 4,203,063
DATED : May 13, 1980
INVENTOR(S) : Paul Loeb, et al

It is certified that error appears in the above-identified patent and that said Letters Patent is hereby corrected as shown below:

Column 7, line 7, after "routing" insert --logic--;

Column 7, line 16, after "enter" insert --NAND--;

Column 8, line 54, "decive" should be --device--;

Column 12, line 3, "singals" should be "signals--.

Signed and Sealed this

Twenty-third Day of December 198

[SEAL]

Attest:

SIDNEY A. DIAMOND

Attesting Officer     Commissioner of Patents and Trademar